United States Patent [19]
Ong

[11] Patent Number: 6,020,840
[45] Date of Patent: Feb. 1, 2000

[54] METHOD AND APPARATUS FOR REPRESENTING ANALOG WAVEFORMS IN DIGITAL FORM BASED ON A MULTIPLIER, ELAPSED TIME AND POLARITY

[76] Inventor: Lance Ong, 771 Riverview Ave., Teaneck, N.J. 07666

[21] Appl. No.: 08/998,244

[22] Filed: Dec. 24, 1997

[51] Int. Cl.⁷ .............................. H03M 1/12; H03M 1/34
[52] U.S. Cl. ........................................ 341/155; 341/158
[58] Field of Search .................................. 341/155, 141, 341/51, 110, 157, 166, 123; 704/213, 211; 370/268; 360/32, 48; 365/45

[56] References Cited

U.S. PATENT DOCUMENTS

| | | | |
|---|---|---|---|
| 4,076,966 | 2/1978 | Bovo et al. ............................. | 370/268 |
| 4,370,643 | 1/1983 | Kitamura ............................... | 341/123 |
| 4,680,797 | 7/1987 | Benke .................................... | 704/211 |
| 4,763,207 | 8/1988 | Podalak et al. ......................... | 360/32 |
| 5,157,727 | 10/1992 | Schloss .................................. | 704/213 |
| 5,204,833 | 4/1993 | Aoki ...................................... | 365/45 |

*Primary Examiner*—Michael Tokar
*Assistant Examiner*—Patrick Wamsley
*Attorney, Agent, or Firm*—Amster Rothstein & Ebenstein

[57] ABSTRACT

A method and apparatus for converting an analog waveform into digital messages and for reconstructing the analog waveform from the information contained in the digital messages. The digital messages describe a change in amplitude of the analog waveform, the polarity or direction of the change in amplitude and the elapsed time for the change in amplitude. Each digital message is created upon the occurrence of a change in amplitude which exceeds a predetermined or predefined threshold voltage. The digital messages may in some instances be combined to compress or lessen the total number of digital messages necessary to reconstruct the analog wave. Using the information in the digital messages, the analog waveform can be reconstructed without the use of smoothing filters.

23 Claims, 4 Drawing Sheets

METHOD AND APPARATUS FOR REPRESENTING ANALOG WAVEFORMS IN DIGITAL FORM BASED ON A MULTIPLIER, ELAPSED TIME AND POLARITY

BACKGROUND OF THE INVENTION

1. Field of the Invention

The present invention relates generally to a method and apparatus for encoding and decoding a waveform, and, in particular, to a method and apparatus for representing a waveform as digital messages which are formed independently of a specific sampling rate.

2. Prior Art

In a conventional system for converting an analog signal into a digital signal, a reference clock is used to generate a periodic train of pulses. Upon each pulse, the analog signal is sampled and an analog to digital conversion is carried out.

At the end of each conversion a binary code is produced which is proportional to the amplitude of the sampled analog signal. The conversion process is repeated within each tick of the clock resulting in a staircase-like amplitude approximation of the original waveform. The accuracy of this reconstruction depends on a number of factors including the rate at which the waveform is sampled, the time required to complete each A/D conversion and the frequency content of the original signal.

In most conventional systems a sampling speed or rate is selected and fixed, as determined by the reference clock, for use during the entire A/D conversion of the original waveform. In selecting the optimum sampling frequency, a sampling theorem commonly known as the "Nyquist Theorem" is most often used. According to the Nyquist Theorem, if a waveform is sampled at a speed or rate that is approximately greater than twice the highest frequency component present in the waveform then in theory it is possible to accurately reconstruct the original waveform from these samples.

As might be expected, in the case of high frequency analog waveforms, A/D conversion methods which employ a Nyquist Theorem based sampling rate tend to generate a high number of data samples. It is preferable, whenever possible, to minimize the total number of samples necessary to reconstruct a waveform. Fewer data samples require a shorter period of time to transmit and require smaller memory reserves for storing and saving the samples.

A high number of samples is particularly undesirable when only a fraction of the samples are needed to accurately reconstruct the original waveform. For example, in an analog waveform having a combination of low and high frequency components it is not necessary and in fact undesirable to sample the low frequency components at the sampling speed necessary for accurately reproducing the high frequency components. Using conventional techniques the entire waveform would be sampled at a sampling rate best suited for reproducing the high frequency components of the multi-component waveform. This would result in an unnecessarily high number of data samples being generated.

In an effort to address these undesirable consequences of employing a fixed conventionally derived sampling rate, there are known in the prior art a number of systems and methods which incorporate a frequency monitoring stage for dynamically varying the sampling rate according to the changing frequencies of a waveform. Upon a change in the frequency component of a sampled waveform, the dynamic stage is designed to vary the sampling rate to a rate which is more appropriate for reconstructing the particular frequency component being sampled. Depending on the waveform, the sample rate may be increased for high frequency components or decreased for low frequency components. As a result of dynamically controlling the sampling rate the conversion is made more efficient and the number of samples taken for accurately reproducing the waveform is optimized.

Podalak U.S. Pat. No. 4,763,207 is an example of a system and apparatus where varying the sampling rate in accordance with the changes in frequency of the sampled waveform is proposed. Although Podalak represents a satisfactory approach for dealing with the potential consequences of utilizing a fixed sampling rate derived using conventional sampling theorems, the Podalak system proposes the use of expensive hardware in the form of a logic analyzer to determine the optimum sampling frequency. In addition to being prohibitively expensive, the Podalak system continues to implement an analog waveform encoding approach which is tied to a sampling frequency.

Kitamura U.S. Pat. No. 4,370,643 discloses yet another system where the sampling frequency may be adjusted to reflect changes in the frequency of the waveform being sampled. Although Kitamura proposes an apparatus and method which can be implemented at a far less cost than that of Podalak, Kitamura remains a method and apparatus which reflects a marriage to the conventional way of thinking in waveform reproduction.

Although the prior art apparatuses and methods have been effective in reducing the total number of data samples necessary to reproduce a waveform of varying frequency, these methods and apparatuses nevertheless represent only an extension or adaptation of conventional methods. That is, although they manage to circumvent some of the drawbacks of the prior art systems, they continue to rely on the basic theory underlying the prior art systems, namely, A/D conversion of a waveform utilizing an "ideal" sampling rate. As a result, the converted analog waveform data is still represented as a series of amplitude points corresponding to the sampled original waveform which must, at some point, be passed through a smoothing filter in order to approximately reconstruct the original waveform.

Furthermore, the problems common to conventional A/D conversion techniques which rely on a sampling rate including quantization errors and aliasing have not been overcome. As is known in the art, quantization noise and aliasing can significantly deteriorate the quality and accuracy of the reproduced waveform.

Thus a need continues to exist for a method and apparatus for compressively approximating an analog waveform which does not rely on a fixed or varying sampling rate.

Still a further need exists for a system and apparatus which can be used to compressively approximate an analog waveform without the need for an inordinate amount of memory for storing derived samples.

The object of the present invention, like the prior art systems, is to encode or represent an original analog waveform as a series of digital messages which can be used to precisely reconstruct the original analog waveform. It is expected that the benefits of the present invention will extend to applications in the field of Digital Audio, data transmission over low to medium bandwidth networks such as the Internet and to the field of data acquisition in general.

To that end, it is a general object of the present invention to provide a method and apparatus that has intrinsic advantages over conventional conversion techniques in that there is no one to one relationship between the number of data samples and a system or reference clock and as a consequence does not have a fixed data rate per second. Instead, the number of sample data dynamically fluctuates based on the frequency and amplitude content of an original analog waveform.

It is another object of the present invention to provide a method and apparatus which is not based on the sampling theorem or variations thereof.

It is a further object of the present invention to provide a method and apparatus which automatically adjusts to varying frequency components in a sampled analog waveform.

It is yet another object of the present invention to provide a method and apparatus which performs dynamic data compression of the previously sampled data.

It is yet a further object of the present invention to provide a method and apparatus which permits the reconstruction of an original waveform from the sample data without using smoothing circuitry.

SUMMARY OF THE INVENTION

In accordance with the stated objectives and other objectives which will hereinafter become apparent, there is provided a method and apparatus for representing an analog waveform as a plurality of digital messages describing a segment or sample of the analog waveform at a particular moment in time. In particular, each digital message marks the detection by the apparatus of a certain minimum change in the amplitude of the original analog waveform. The minimum change in amplitude needed to trigger the creation of a digital message is a variable value which is selected by the user of the apparatus prior to converting or encoding a waveform. The preselected value is fixed for the entire encoding operation and represents a threshold voltage which must be exceeded before a conversion of a segment of the analog waveform is performed.

Upon each detected occurrence of a change in amplitude which is substantially equivalent to the value of the predefined threshold voltage, a digital message describing that particular segment of the waveform is generated. Each generated digital message may contain information regarding the magnitude of the change in amplitude, the elapsed time or duration of that detected change in amplitude, and the polarity or direction of that detected change in amplitude.

After the full waveform conversion is completed, the resulting plurality of digital messages may be immediately converted to reproduce the original analog waveform, transmitted to a remote location for reproduction of the original analog waveform at a remote location, or stored for later use.

In accordance with the above, the apparatus of the present invention comprises a means for establishing and fixing a threshold voltage, and a means for detecting a change in the amplitude of the sampled waveform which is substantially equivalent to the predefined threshold voltage ("minimum change in amplitude"). Upon the detection of a minimum change in amplitude, the detecting means generates a signal which indicates that said minimum change in amplitude has occurred and identifies the polarity of that detected minimum change in amplitude. The apparatus further comprises a clock or timer means for measuring the elapsed time of a minimum amplitude change in the waveform and a microprocessor which is responsive to the signal generated by the detecting means and clock or timer means for creating a digital message.

In a preferred embodiment, the detecting means includes a means responsive to said signal for sampling and holding said amplitude change of said waveform for use in detecting subsequent minimum changes in amplitude. The detecting means further comprising a comparator means for detecting the occurrence of a minimum amplitude change and the polarity of such change.

Also in accordance with the objects of the present invention, there is further provided a method and apparatus for compressively representing an analog waveform as a plurality of new or final data messages. The new or final data messages represent a combination of sequential data messages having substantially equivalent elapsed times. In effect the combination of sequential data messages having substantially equivalent elapsed times represents a slope integration along selected segments of the analog waveform. The slope integration or compression reduces the total number of data messages necessary to accurately recreated the analog waveform.

There is also a method and apparatus for reproducing an analog waveform which has been represented as a plurality of data words wherein each of said data words includes a data field identifying a minimum change in amplitude, a data field indicating a polarity for said minimum change in amplitude and a data field indicating the elapsed time of said minimum change in amplitude. The apparatus comprises a microprocessor for retrieving each of the data words from a storage medium, a means for generating a reference clock coupled to to the microprocessor and a voltage source coupled to the microprocessor and responsive thereto for outputting an analog waveform in accordance with the information in stored data fields of the retrieved data words.

BRIEF DESCRIPTION OF THE DRAWINGS

The above and related objects, features and advantages of the present invention will be more fully understood by reference to the following detailed description of the presently preferred, albeit illustrative, embodiments of the present invention when taken in conjunction with the accompanying drawings, wherein.

DETAILED DESCRIPTION OF THE PREFERRED EMBODIMENTS

Figure 1:
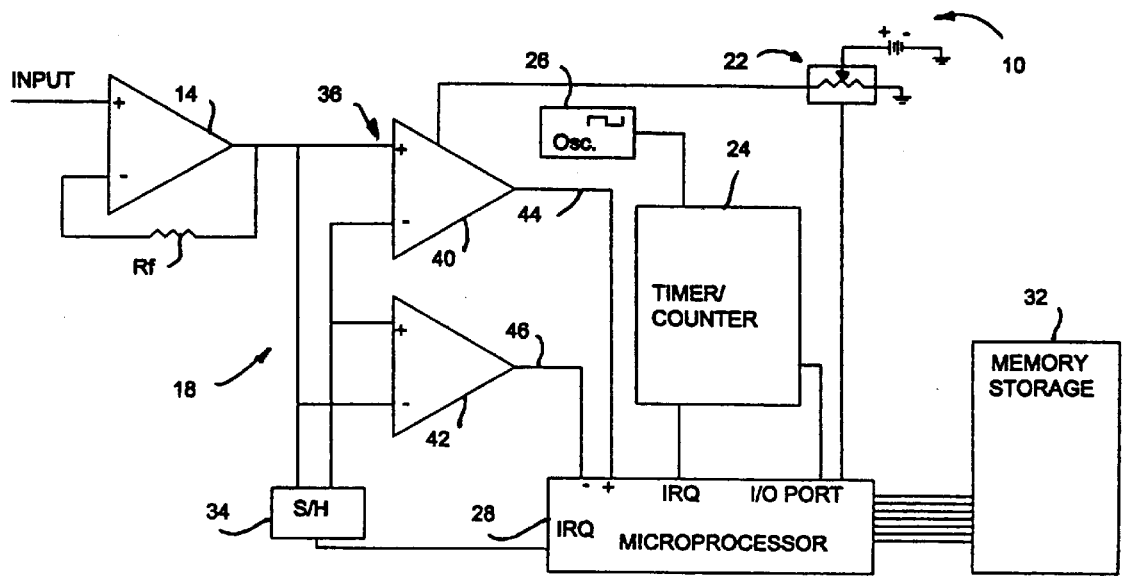
FIG. 1 is a schematic block diagram of an apparatus for encoding a waveform as digital messages in accordance with the present invention.
Figure 2:
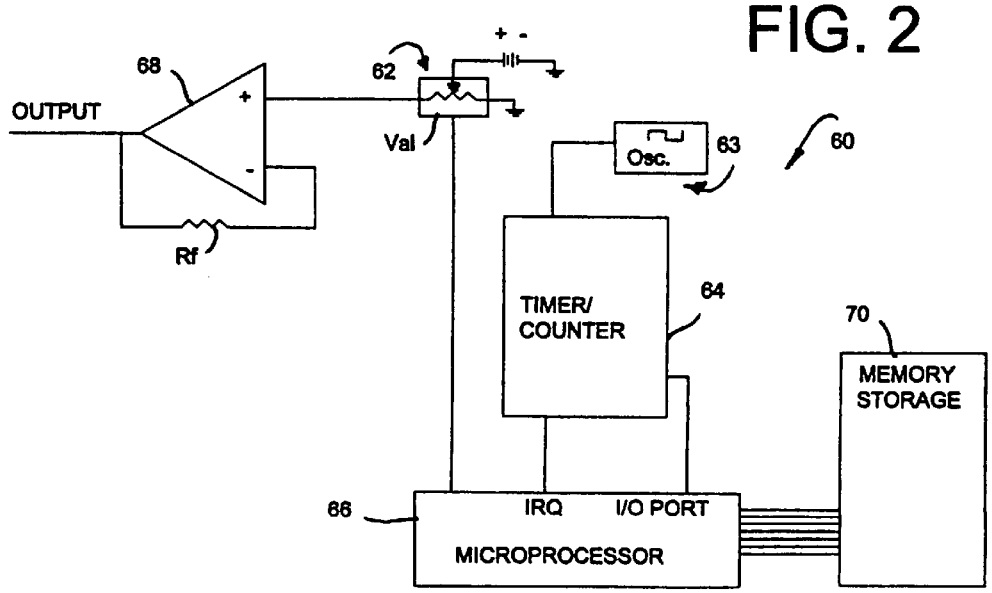
FIG. 2 is a schematic block diagram of an apparatus for reproducing an original waveform from digital messages derived from an apparatus and method in accordance with the present invention.

Referring now to the drawings and in particular to FIG. 1 thereof, therein illustrated is an apparatus including electronic circuitry, a microprocessor and software for encoding an analog waveform as a series of digital messages in accordance with a preferred embodiment of the present invention. In FIG. 2, there is shown a counterpart apparatus which may be utilized to reproduce the original analog waveform by decoding the digital messages generated by the apparatus of FIG. 1. Although not specifically shown in the Figures, the apparatuses of FIGS. 1 and 2 may be combined into an encoding/decoding system which may utilize a single memory and single microprocessor to process a waveform.

As shown in FIG. 1, the schematic block diagram illustrates an encoding apparatus, generally designated by the reference numeral 10, in accordance with a preferred embodiment. The encoding apparatus 10 is generally comprised of six components or stages acting on an input analog waveform to convert the waveform into a series of digital messages representing the movement of the waveform in real time. At the input stage, the encoding apparatus 10 preferably includes a low noise input gain stage 14 for amplifying the peak to peak voltage of the input waveform; a detecting means generally designated by the reference numeral 18; a voltage source generally designated by the reference numeral 22; a timer/counter 24, a high frequency clock source 26, a microprocessor 28; and optionally a storage memory 32 for archiving the digital messages describing a particular analog waveform.

The encoding apparatus 10 performs an analog to digital conversion of a waveform essentially by breaking the input waveform into segments representing a certain minimum change in amplitude of the waveform. Upon every detection of a minimum change in amplitude in the waveform, the creation of a digital message is triggered. The minimum change in amplitude for triggering the creation of a digital message is preferably a value in the microvolt range which is selected prior to beginning a waveform encoding operation and remains fixed throughout.

In selecting the minimum change in amplitude, it may be necessary to first determine the noise components of the waveform to be sampled. In this manner a trigger level may be selected which is high enough to avoid the creation of digital messages that merely represent changes in amplitude corresponding to noise present in the original waveform. Once a minimum value is selected, the value is input and fixed by means of the voltage source 22 which is preferably a digitally controlled voltage source or potentiometer. In the preferred embodiment, the voltage source 22 is connected between the detection means 18 and microprocessor 28.

Briefly, when the amplitude of the input waveform changes a value that is substantially equivalent to the threshold voltage established by voltage source 22, a minimum change in amplitude has occurred which is detected by apparatus 10 triggering the formation of a descriptive digital message. Substantially at the same time a measurement of the elapsed time for the minimum change in amplitude is made and the polarity or direction of the minimum change in amplitude is detected. The elapsed time information and polarity are stored as part of the same descriptive digital message.

As the digital message preferably describes three aspects or characteristics of a tracked segment of the waveform, the preferred format of the digital message is a 32 bit data word wherein bit 32 represents the polarity or direction of the minimum change in amplitude, bits 25–31 represent a multiplier of the minimum change in amplitude and bits 1–24 are used to store the measured elapsed time of the minimum change in amplitude. It should be noted that as the minimum change in amplitude is fixed, a non-compressed data word will typically have a multiplier of one.

In accordance with a preferred embodiment of the invention, an analog waveform to be converted or encoded is first connected to the positive input of the gain stage 14 which as is shown may be a conventional operational amplifier 32 having negative feedback through feedback resistor Rf. The amplified or conditioned signal is then fed to an input side of the detecting means 18 which preferably includes a sample and hold circuit 34 and comparator circuit generally designated by reference numeral 36.

In particular, the output of the input gain stage 14 is coupled to the to the input of the sample and hold circuit 34, the positive node of a first comparator 40 and the negative node of a second comparator 42. As indicated further in FIG. 1, voltage source 22 is electrically connected to each of comparators 40, 42 for use in detecting the occurrence of a minimum change in amplitude.

In operation, one of comparators 40, 42 may generate a signal at each occurrence of a change in amplitude of the waveform which is substantially equivalent to the level supplied by the voltage source 22. In the event comparator 40 is triggered, a positive minimum change in amplitude has occurred; and in the event comparator 42 is triggered, a negative minimum change in amplitude has occurred.

The outputs of comparators 40, 42 are fed into separate interrupts of microprocessor 28 via connections 44, 46 for distinguishing between the positive and negative minimum changes in amplitude. Upon the firing of one of comparators 40 or 42, the corresponding interrupt receives an input allowing the microprocessor 28 to identify the direction of the minimum change in amplitude and further causing the microprocessor 28 to enable the sample and hold circuit 34.

Once enabled, the sample and hold circuit 34 captures the current value of the conditioned waveform which is being fed from the output of the amplifier 14. The held or captured value is substantially simultaneously fed from the output of the sample and hold circuit 34 to the negative node of comparator 40 and the positive node of comparator 42 via connection. This configuration permits the apparatus 10 to dynamically detect each subsequent occurrence of a minimum change in amplitude as measured between the positive and negative nodes of comparators 40, 42. The process is repeated until the waveform conversion is completed.

As previously mentioned, upon each occurrence of a minimum change in amplitude a measurement of the elapsed time for the minimum change in amplitude is performed and the time value is included in bits 1–24 of the data word. In the apparatus 10, the timer/counter 24 in combination with the high speed clock source 26 are used to measure the elapsed time.

As shown, the timer/counter 24 is coupled to the high speed clock source 26 which is preferably a quartz crystal oscillator. The timer 24 is preferably comprised of a package of three-eight bit timers which permit up to a 24 bit countdown. Conceivably, with such an arrangement, the reference clock can be configured to clock the occurrences of minimum changes in amplitude at a rate of 16 MHZ.

Generally, in deciding on the speed of the reference clock or time base to be used in measuring the time between the start and end of a minimum change in amplitude, the clock speed must be sufficiently high to mark the time of a voltage transition event accurately enough to prevent skewing in the reproduced waveform. Skewing may occur if the speed or frequency of the reference clock is selected such that when a detectable change in amplitude occurs, it occurs between ticks or pulses of the reference clock with too much room on either side of the transition. As a result a detectable change in amplitude is associated with the nearest clock tick which may lead to an inaccurate reconstruction of the original waveform.

For example, in the case of an audio waveform which has a frequency response of 20 Khz, an appropriate reference clock frequency might be 10 Mhz or 500 times the highest frequency response. In this manner, the occurrence of detectable changes in amplitude may be associated with a more precise point in time so as to minimize skewing.

Although a reference clock is utilized, the apparatus 10 does not have a fixed data rate per second. The data rate and quantity fluctuate depending on the frequency and amplitude content of the particular waveform fed into apparatus 10. Low frequency waveforms have a much longer periodic wave and, consequently, a change in amplitude takes longer to reach each detectable threshold point. This gives an output which intrinsically exhibits a data compression characteristic such that in moments of silence a digital message may only occur once every 24 bit period. The highest concentration of data will occur when the waveform contains a high frequency content of a high amplitude.

Figure 3:
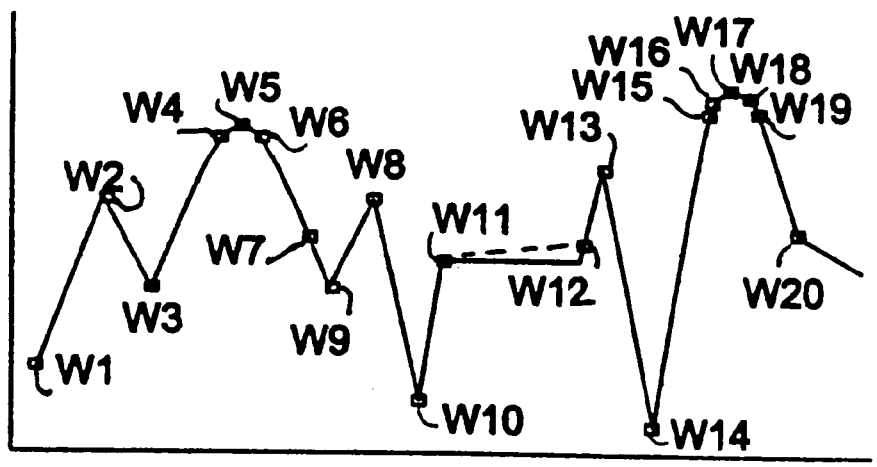
FIG. 3 shows a representation of a waveform having indicated thereon positions where compressed digital messages would likely be created in accordance with the present invention.

Data compression may be enhanced or supplemented by performing a slope integration along a section of a sampled waveform. In accordance with a method of the present invention, data words having a common slope as determined by the minimum change in amplitude, which is fixed, and the elapsed time for the change in amplitude, which is variable, may be combined into a single new data word representing all sequential data words along a common slope. In FIG. 3, a sample waveform is shown having new data words W1–W20. Data word W4, for example, represents a combination or slope integration of the individual data messages which were generated to describe the segment of the waveform between W3 and W4.

In a preferred embodiment, slope integration is accomplished by performing a comparison of the elapsed times of sequential data words. In the instance where sequential data words have an equivalent elapsed time, within a given tolerance, the sequential data words are combined to form a new or final data word. The new or final data word describes a total elapsed time and further describes the total change in amplitude of the waveform during that elapsed time by a multiplier representing the total number of occurrences of a minimum change in amplitude. Thus, for example, if three sequential data words are combined to form a new or final data word, the multiplier representing the minimum change in amplitude would be three.

Figure 4:
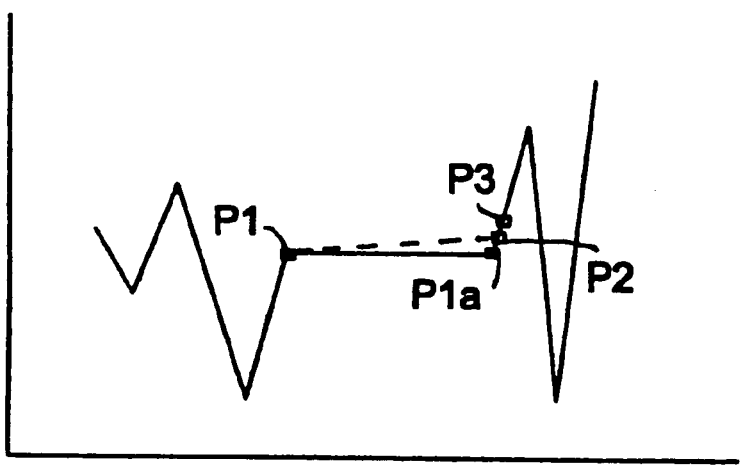
FIG. 4 is a segment of a representational waveform indicating a derived data point corresponding to a flat line condition in the waveform.

An additional operation which may be performed on the data words is useful in determining the start of a minimum change in amplitude after a period where no signal has been detected, otherwise known as a flat line condition. The operation essentially derives a data word representing a data point along the waveform which has not been detected but rather calculated and interposed based on the information contained in data words created prior to and immediately after the calculated data point. In FIG. 4, the derived data point is represented as point P1a located between points P1 and P2. As shown in FIG. 4, if a data message representing point P1a is not inserted as a point the recreated waveform would resemble more closely the waveform represented by the dotted line extended between the points P1 and P2.

The operations of slope integration and flat line tracking will become more apparent upon an understanding of the microprocessor 28 operations during a waveform conversion. Accordingly the remainder of the operation of the apparatus 10 and method of the present invention will be described in connection with the operation of the microprocessor 28.

Briefly describing the function of the microprocessor 28, the microprocessor 28 monitors interrupts generated by either of the two comparators 40, 42 and the timer 24. At the start of a conversion and recording process the following occurs: the microprocessor initializes the components, which includes establishing the threshold voltage for the conversion as fixed by voltage source 22, setting the sample and hold circuit to a 0-volt level, loading the timer 24 with a divisor value to achieve a desired reference clock rate and zeroing the software counters for clocking the elapsed time of a minimum change in amplitude.

Following initialization, the microprocessor is ready to generate a digital message. To that end the timer 24 begins to run and upon each timer countdown, the timer generates an interrupt via line 50 to the microprocessor which upon request increments a timer variable. The timer variable preferably located in the microprocessor 28 tracks the elapsed time for every occurrence of a detected minimum change in amplitude. If the timer variable reaches a maximum value without there having occurred a minimum change in amplitude, the microprocessor 28 generates a data word having a multiplier value of zero indicating that a minimum change in amplitude has not occurred within a maximum period of time as limited by the 24 bit size of the data field.

The value of the timer variable per occurrence of a detected minimum change in amplitude is temporarily stored in a work buffer by the microprocessor. The elapsed time value is retrieved and written to a data word together with the polarity and multiplier field information. Upon the writing of the data word a flag is set indicating that the data word is ready for further processing by the microprocessor 28.

The microprocessor 28 is preferably equipped with at least two buffers (not shown) which are used to temporarily store the created data words. Initially data words are stored in a first buffer (Buffer 1) and following a slope integration or flat line tracking operation are stored in a secondary buffer (Buffer 2). The data words stored in the secondary buffer are the final data words which contain the information for reproducing the original waveform.

Figure 5:
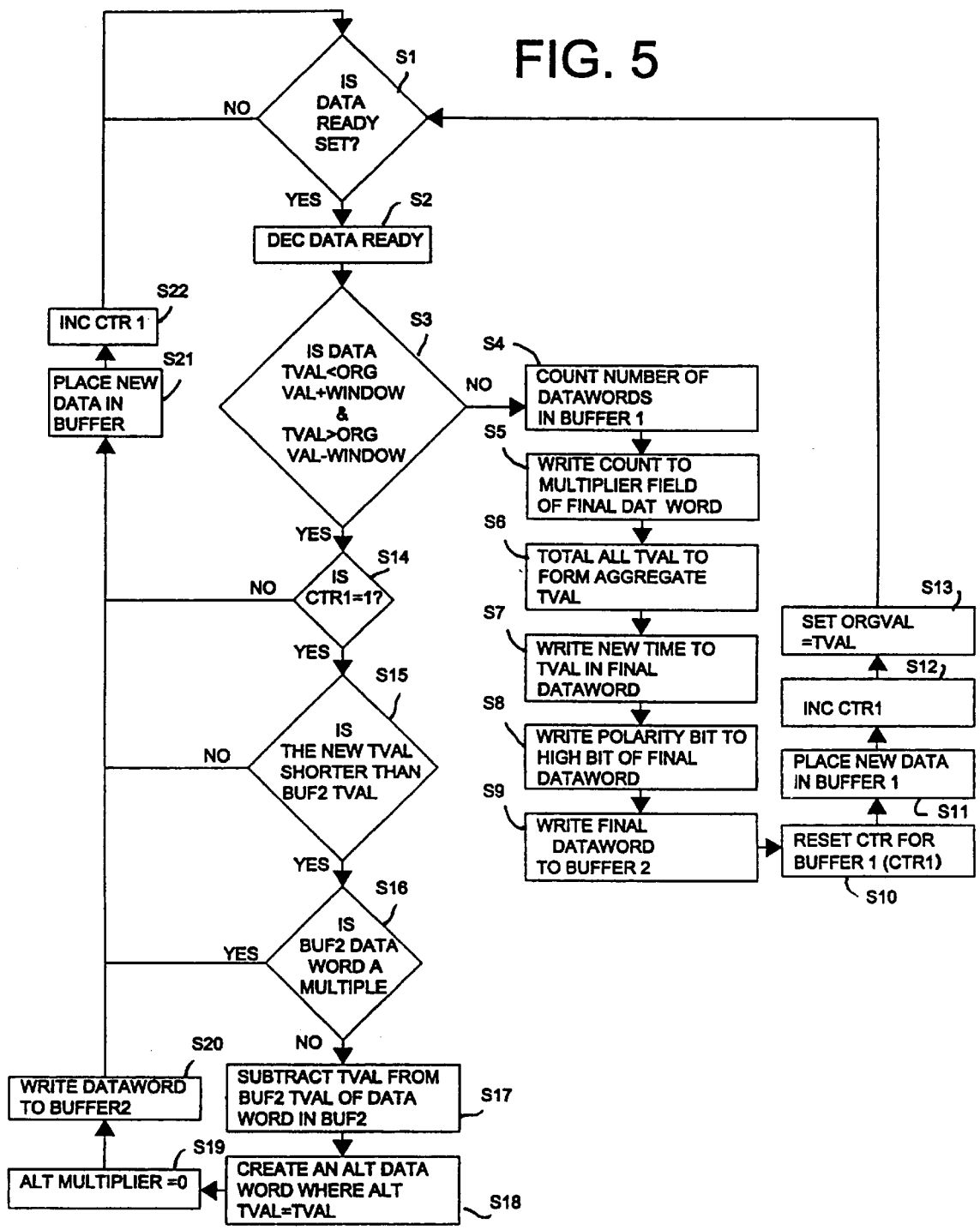
FIG. 5 is a flowchart description of a microprocessor operation.

The typical operation of a main routine of the microprocessor is best understood in connection with FIG. 5 which includes a description of the operations of slope integration and flat line tracking. In a first steps S1 and S2, each newly created data word is detected as indicated by a data ready signal and processed by the microprocessor 28. In step S3, the elapsed time, Tval, of the newly created data word is compared to the elapsed time, Orgval, of an immediately prior data word held in the first buffer, if any. If the elapsed times Tval and Orgval are not equivalent within a plus and minus tolerance, a final data word having a new Tval and multiplier is generated and stored in the secondary buffer.

As represented in steps S4 to S9, in generating the final data word the data words then present in the first buffer are totaled. This total is written to the multiplier field of the final data word. The Tval of the final data word is derived by aggregating the Tval for each data word then present in the first buffer. The aggregate Tval is then written to the Tval of the final data word. The final data word including the correct polarity is written to the secondary buffer.

Following this operation, the first buffer is reset and the newly created data word is placed as the first entry in the first buffer, the buffer address counter is incremented and Tval is set equal to Orgval. The microprocessor 28 is now ready to receive and process the next newly created data word.

As indicated in steps S3 and S14, if Tval of a newly created data word is equivalent to Orgval within a certain positive and negative window, the newly created data word is checked to determine its location in the first buffer. If the newly created data word is in any location in the first buffer other than the second position, the newly created data word is written to the first buffer and the buffer address counter is incremented by 1. The microprocessor 28 is again ready to process the next newly created data word.

Steps S15 to S20 are performed if the newly created data word is in the second position in the buffer. In accordance with steps S15–S20, the Tval for the newly created data word is compared against the Tval for the last stored data word in buffer 2. The Tval for the buffer 2 data word is determined by dividing the total elapsed time field by the multiplier field. If Tval of the newly created data word is smaller than Tval for the buffer 2 data word and not a multiple thereof then a next final data word is written to the secondary buffer having a polarity of the buffer 2 data word, a multiplier of 1, and a Tval equal to that of the Tval for the newly created data word. The routine then subtracts Tval of the newly created data word from Tval of the buffer 2 data and changes the Tval of the buffer. This modified final data word of buffer 2 is written to the secondary buffer. The newly created data word is placed in the first buffer and the buffer address counter is incremented by 1. The microprocessor 28 is ready for the next newly created data word.

At step S15, if the Tval of the newly created data word is larger than Tval of the buffer 2 data word, the microprocessor writes the newly created data word to the first buffer, buffer 1, and increments the buffer address counter by 1. The microprocessor 28 is ready for the next newly created data word.

The microprocessor 28 will continue its routine until each data word is processed. At the end of the final data processing words stored in the secondary buffer may be transferred to the storage memory 32. Once in the storage memory 32, the data words may be retrieved by a decoding apparatus in order to reproduce the original waveform.

Referring now to the schematic block diagram of FIG. 2, therein illustrated is a decoding apparatus, generally designated by the reference numeral 60, for reconstructing or reproducing an original analog waveform from the information contained in the plurality of digital messages in accordance with a preferred embodiment. The digital messages are preferably in the format already described herein, namely, a 32 bit data word wherein bit 32 represents the polarity or direction of the minimum change in amplitude, bits 25–31 represent a multiplier of the minimum change in amplitude and bits 1–24 are used to store the measured elapsed time of the minimum change in amplitude.

The decoding apparatus 60 is generally comprised of four components or stages acting to retrieve and convert a plurality of sequentially stored data words into a precise reconstruction of the original analog waveform. The decoding apparatus 60 is comprised of a voltage source generally designated by the reference numeral 62, preferably a digital potentiometer, a high frequency clock source 63 and timer/counter package 64 to give a programmable time base or reference clock of flexible duration, a microprocessor 66, and an output gain stage 68. The digital messages are retrieved from a storage memory 70 or some type of external memory device which has not been shown in the figures.

In general, the decoding or D/A conversion is conducted in an inverse manner to the encoding or A/D conversion. The timer 64 is loaded with a clock value for the conversion. Initially the clock value should be the same as that used in the A/D conversion. Like the timer of the encoding apparatus 10, the timer 64 may comprise three eight bit timers for establishing the time base or reference clock of apparatus 60.

In reconstructing the original waveform from the recorded digital messages or data words, the microprocessor 66 which, as shown in FIG. 2, is coupled to the digital potentiometer 62 and timer 64 is first initialized. Initializing the microprocessor 66 includes loading the timer 64 with the appropriate divisor for the desired reference clock and zeroing the software counters.

Following initialization the microprocessor 66 executes a fetch cycle and retrieves a first data word from memory 70. The microprocessor 66 multiplies the threshold voltage by the value stored in the multiplier field of the retrieved data word to derive a full voltage range. The full voltage range is used to calculate the increments of voltage change relative to the total elapsed time contained in the time field of the retrieved data word. The incremental voltage change is then applied to the digital voltage source in a manner proportional to the total elapsed time as indicated by the retrieved data word. This process is repeated for every retrieved data word.

Figure 6:
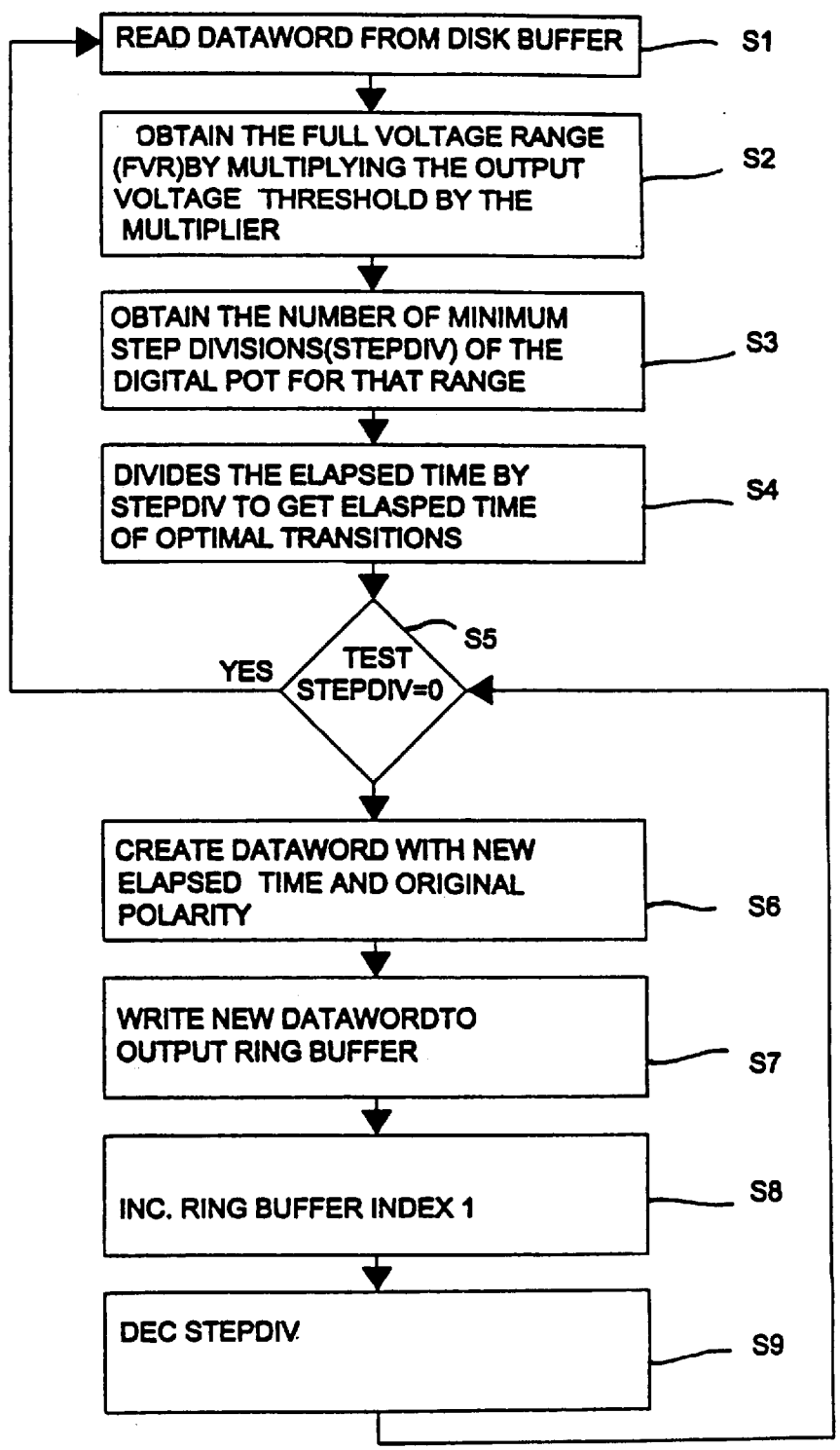
FIG. 6 is a flowchart description of a microprocessor operation.

To improve the quality of the output waveform, each data word retrieved from memory 70 is further subdivided into yet smaller data words by taking advantage of the generally higher grain or output resolution of the digital potentiometer 62. As indicated in steps S1 to S9 of the flowchart of FIG. 6, the full voltage range of each retrieved data word is divided by the maximum resolution of one increment of the digital potentiometer 62. This gives the number of step divisions available for a smooth output transition over time in accordance with the generally higher resolution of the digital potentiometer 62.

Next, in step S4, the elapsed time represented in bits 1–24 of the retrieved data word is divided by the total number of step divisions to create a string of new data words that represent one step of the digital potentiometer 62 that is to occur at averaged divisions of time points across the total elapsed time of the retrieved data word.

The elapsed time of each of the newly created string of data words is loaded into a timer variable. The timer 64 which is connected to an interrupt or IRQ pin on the microprocessor 66 generates a signal at each count down of the timer 64. At each timer 64 interrupt, the timer variable is decremented until the value reaches zero. When the timer variable reaches zero the routine increments or decrements the level of the digital potentiometer by one unit of resolution. It then reloads the timer variable with the next new data word and follows the same procedure until all the new data words have been transmitted and output via gain stage 68 which is coupled to the output of the digital potentiometer 62. This process is repeated for each of the remaining data words stored in memory 70 until the full original waveform has been recreated.

By recreating the analog waveform in this manner, it is possible to eliminate the need for the output smoothing filters otherwise necessary to reconstruct an analog waveform using conventional technologies.

In order to optimize the amount of data, it is possible to insert realtime messages which alter the response of the Digital to Analog converter to allow for additional compression. For example, a realtime message may be used to change the value of the trigger or threshold voltage to a value different than the startup value or to inversely change it back. In this manner the recreation of a particular segment of the waveform may be adjusted to coincide with the number of data words which have been created to describe that particular segment of the original waveform.

Now that the preferred embodiments of the present invention have been shown and described in detail, various modifications and improvements thereon will become readily apparent to those skilled in the art. Accordingly, the spirit and scope of the present invention is to be construed broadly and limited only by the appended claims, and not by the foregoing specification.

What is claimed is:

1. A method of representing a waveform as a plurality of digital messages, each digital message describing a segment of said waveform at a particular moment in time, comprising the steps of:

selecting and fixing a threshold voltage for use in triggering the creation of said each digital message;

detecting in said analog waveform the occurrence of an amplitude change which is substantially equivalent to said threshold voltage;

detecting the polarity of said change in amplitude;

measuring an elapsed time corresponding to the duration of said occurrence of an amplitude change which is substantially equivalent to said reference voltage;

generating a plurality of digital messages, each said digital message having information corresponding to said change in amplitude, the polarity of said change in amplitude and the elapsed time for said change in amplitude.

2. The method of claim 1 wherein said generated data messages are sequentially stored in a storage memory.

3. The method of claim 1 further comprising the step of amplifying said waveform prior to representing said waveform as said plurality of digital messages.

4. The method of claim 1 wherein said detecting step further comprises the step of initiating a sampling and holding of the amplitude of said analog waveform upon the detection of a first said change in amplitude substantially equivalent to said reference voltage.

5. The method of claim 4 wherein said detecting step further comprises the step of comparing said analog waveform to a sampled and held amplitude for detecting each subsequent occurrence of a change in amplitude substantially equivalent to said reference voltage.

6. The method of claim 1 wherein said digital message comprises a thirty two bit data word.

7. The method of claim 6 wherein bits 1–24 represent said elapsed time, bits 25–31 represent a multiplier field for indicating said change in amplitude, and bit 32 identifies said polarity of said change in amplitude.

8. The method of claim 1 further comprising the step of dynamically compressing the total number of said plurality of digital messages necessary for reconstructing said analog waveform wherein the information of at least two digital messages of said plurality of digital messages is combined to form a final digital message.

9. The method of claim 8 wherein said at least two digital messages are sequential and wherein an elapsed time for each of said at least two digital messages is compared, said at least two digital messages being combined when said elapsed times are substantially equivalent.

10. The method of claim 8 wherein said step of dynamically compressing the total number of said plurality of digital messages is initiated upon the detection of a digital message of said plurality of digital messages having an elapsed time which is not substantially equivalent to an elapsed time of an immediately preceding digital message of said plurality of digital messages.

11. An apparatus for representing an analog waveform as digital messages, each digital message formed upon the detection of a certain minimum change in amplitude in said analog waveform comprising;

means for establishing a threshold voltage;

means coupled to said threshold voltage for detecting a certain minimum change in the amplitude of said waveform, said certain minimum change in amplitude having a value substantially equivalent to said threshold voltage, said means for detecting including a means for detecting the polarity of said certain minimum change in amplitude, said detecting means producing a signal indicating that said certain minimum change in amplitude has occurred and identifying the polarity of said certain minimum change in amplitude;

a means for measuring an elapsed time of each said detected certain minimum change in amplitude;

a microprocessor coupled to said means for measuring an elapsed time and said detecting means, said microprocessor being responsive to outputs from said means for measuring an elapsed time and said detecting means for generating said digital messages.

12. The apparatus of claim 11 wherein each of said digital messages includes a field identifying said certain minimum change in amplitude, a field identifying said polarity of said certain minimum change in amplitude and a field identifying said elapsed time of said certain minimum change in amplitude.

13. The apparatus of claim 11 wherein said detecting means comprises a means for sampling and holding an amplitude value of said waveform for use in detecting each subsequent certain minimum change in amplitude in said analog waveform.

14. The apparatus of claim 13 wherein said detecting means further comprises a pair of analog comparators coupled to said sampling and holding means, each of said comparators comparing said analog waveform against said amplitude value held in said means for sampling and holding.

15. The apparatus of claim 11 wherein said means for establishing a threshold voltage comprises a digitally controlled voltage source.

16. The apparatus of claim 11 wherein said means for measuring said elapsed time of said certain minimum change in amplitude comprises a clock source coupled to three 8-bit timers.

17. The apparatus of claim 11 further comprising a memory coupled to said microprocessor for storing said digital messages.

18. The apparatus of claim 11 further comprising a gain stage having an output coupled to said detecting means, for amplifying the amplitude of said waveform.

19. A method of compressively representing an analog waveform as aggregate data words representing a combination of substantially alike segments of said analog waveform, comprising the steps of:

fixing a threshold voltage for use in triggering the formation of a first plurality of data words;

detecting in said analog waveform each occurrence of a certain minimum change in amplitude which is substantially equivalent to said threshold voltage and detecting the polarity of said certain minimum change in amplitude;

measuring an elapsed time corresponding to the duration of said detected certain minimum change in amplitude;

generating said first plurality of data words, each data word of said first plurality of data words having a data field corresponding to said detected certain minimum change in amplitude, a data field corresponding to said polarity of said detected certain minimum change in amplitude and a data field corresponding to said elapsed time of said detected certain minimum change in amplitude;

comparing the elapsed time of consecutive data words of said first plurality of data words;

combining said consecutive data words when said elapsed times are substantially equivalent, each of said aggregate data words being used to represent said combination of consecutive data words having substantially equivalent elapsed times.

20. The method of claim 19 further comprising the step of detecting in said waveform when a minimum change in amplitude has not occurred within a predetermined duration of time and generating a data word having information indicating that said minimum change in amplitude has not occurred within said predetermined duration of time.

21. The method of claim 20 wherein said duration of time is determined by a byte size of said elapsed time data field.

22. The method of claim 19 further comprising the step of detecting an occurrence of said certain minimum change in amplitude immediately following a condition where substantially no change in amplitude has occurred for a duration of time at least as long as said detected occurrence of said certain minimum change in amplitude.

23. The method of claim 22 further comprising the step of generating a data word indicating that no change in amplitude has occurred for said duration of time immediately preceding said detected occurrence of said certain minimum change in amplitude.

* * * * *